United States Patent [19]
van Dijkum et al.

[11] 3,968,439
[45] July 6, 1976

[54] RADIO RECEIVER HAVING A PRESELECTION CIRCUIT TUNED BY A VARACTOR WITH A VARIABLE LIMITER THRESHOLD CIRCUIT TO ATTENUATE LARGE AMPLITUDE SIGNALS

[75] Inventors: Adalbertus Hermanus Jacobus Nieveen van Dijkum; Johannes Gerardus Albertus Kropman, both of Nijmegen, Netherlands

[73] Assignee: U.S. Philips Corporation, New York, N.Y.

[22] Filed: Apr. 25, 1975

[21] Appl. No.: 571,538

[30] Foreign Application Priority Data
May 10, 1974 Netherlands............. 7406291

[52] U.S. Cl.............................. 325/319; 325/376; 325/457; 325/490

[51] Int. Cl.².......................................... H04B 1/18
[58] Field of Search........... 325/319, 376, 383, 387, 325/404, 405, 410, 414, 425, 457, 490, 489, 488

[56] References Cited
UNITED STATES PATENTS
3,571,719   3/1971   Beary.................................. 325/383

Primary Examiner—George H. Libman
Attorney, Agent, or Firm—Frank R. Trifari; Henry I. Steckler

[57] ABSTRACT

Radio receiver provided with varactor tuning. To maintain the signals across the varactor of the preselection circuit sufficiently small the receiver has a controlled input stage which is connected before the circuit and a limiter which has a controlled threshold voltage and is connected to the input circuit.

2 Claims, 1 Drawing Figure

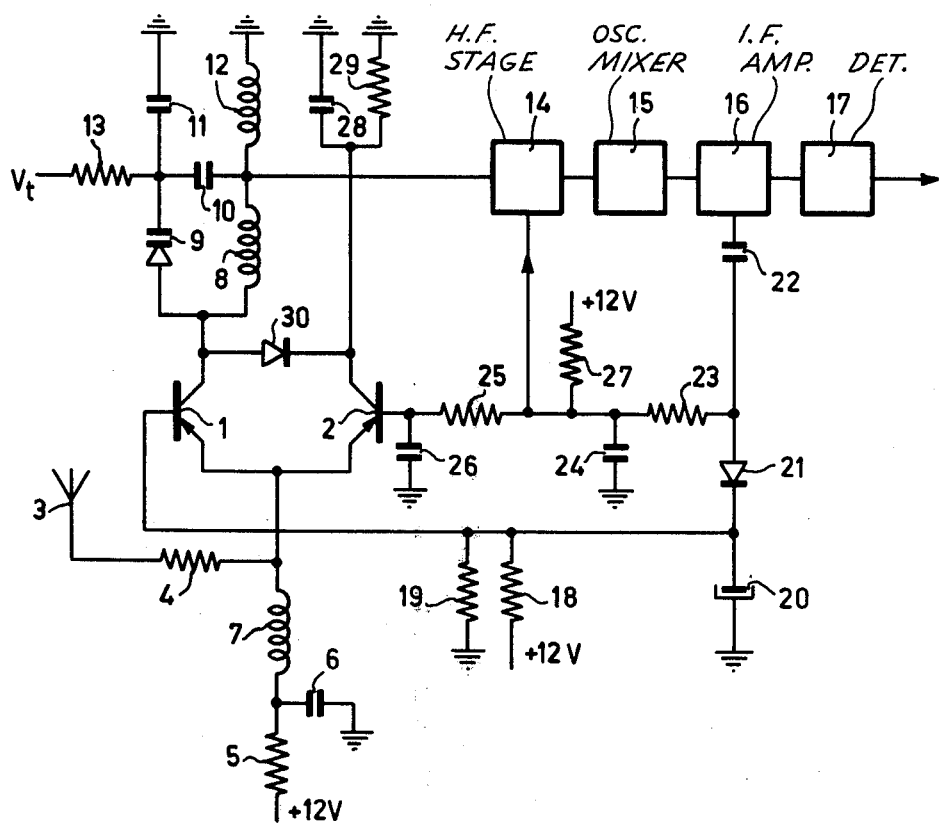

RADIO RECEIVER HAVING A PRESELECTION CIRCUIT TUNED BY A VARACTOR WITH A VARIABLE LIMITER THRESHOLD CIRCUIT TO ATTENUATE LARGE AMPLITUDE SIGNALS

The invention relates to a radio receiver having a preselection circuit tuned by a varactor and a preceding control stage which is controlled by a control voltage derived from a succeeding intermediate-frequency amplifier.

When varactors are used for tuning radio receivers, in particular AM car radio receivers, there is a risk that the preselection circuit has to handle signals of a magnitude such that the varactor or varactors included in this circuit is or are overdriven. Then the capacitance of the varactor depends not only upon the tuning voltage set but also upon the amplitude of the signal applied across the circuit. This gives rise to circuit detuning dependent upon the signal amplitude and to spurious responses and modulation distortion.

A method of protecting the preselection circuit against excessive signals consists in providing a control stage which preceeds the said circuit and is normally controlled by a control voltage derived from the intermediate-frequency signal of the receiver. On reception of a large input signal the control stage has its output reduced to an extent such that the signal applied to the varactor of the circuit remains small enough.

It was found, however, that this method does not give an effective solution of the said problems. This is due to the fact that the intermediate-frequency amplifier generally is considerably more selective than is the preselection circuit. A signal which falls slightly outside the selectivity curve of the intermediate-frequency amplifier produces substantially no control voltage and hence no reduction of the output of the control stage. The signal is applied in full strength to the circuit and gives rise to the afore-mentioned signal distortions.

To prevent the latter disadvantage it has already been proposed to control the control stage by means of a control voltage which is derived from the signal across the preselection circuit itself, as the case may be in conjunction with control from the intermediate-frequency amplifier. This method has the disadvantage that a high-quality expensive control stage including a control voltage amplifier (using, for example, field-effect transistors) is required and that a certain undesirable loading of the preselection circuit is substantially inevitable.

It is an object of the present invention to obviate the said problems in a radio receiver of the type referred to in a simple manner and for this purpose the receiver according to the invention is characterized by a limiter of variable threshold voltage which is connected to the preselection circuit and is controlled by the said control voltage in a sense such that the threshold voltage increases as the intermediate-frequency signal increases.

When tuning to a transmitter signal first the signal voltage across the preselection circuit will increase whilst owing to the higher selectivity of the intermediate-frequency channel no control voltage is yet produced. As soon as the signal voltage across the circuit threatens to assume an excessive amplitude, the limiter commences conducting so that the selectivity of the circuit collapses and the signal amplitude is limited to permissible values. If during the subsequent tuning process the signal comes within the pass-bound width of the intermediate-frequency channel, a control voltage is produced which increases the threshold value of the limiter so that the selectivity of the preselection circuit is restored. At the same time the amplification of the control stage is reduced in a degree such that the signals across the circuit remain within permissible limits. Thus the control stage takes over the signal-attenuating function of the limiter.

The step according to the invention provides a very quiet tuning behaviour of the receiver.

The invention will now be described more fully with reference to the single FIGURE of the drawing which shows an AM radio receiver according to the invention.

Referring now to the FIGURE, an AM radio receiver has an input stage comprising two transistors 1 and 2 the emitters of which are intercoupled. Signals from an aerial 3 are applied via a resistor 4 to the emitters of the transistors 1 and 2. Direct current from a +12 volts supply is supplied to the two emitters through an emitter resistor 5, a smoothing capacitor 6 and a choke 7.

The collector circuit of the transistor 1 includes a tunable high-frequency input circuit which comprises an inductor 8, a varactor 9 and a fixed capacitor 10. The circuit is connected to earth for high frequencies by means of a large capacitor 11, and the direct current from the transistor 1 flows to earth via a choke 12 connected to the junction of the inductor 8 and the capacitor 10. The circuit is tuned to the desired input signal by means of a tuning voltage $V_t$ which is applied through a resistor 13 to the junction of the capacitors 9, 10 and 11. The signals at the junction of the inductor 8 and the capacitor 10 are applied to a second high-frequency stage 14, converted to an intermediate-frequency signal in a self-oscillating mixer stage 15, amplified in a selective intermediate-frequency amplifier 16 and finally detected in a detector 17. The resulting low-frequency audio signals are amplified in a manner, not shown, and applied, for example, to loudspeakers.

By means of a voltage divider comprising resistors 18 and 19 and a smoothing capacitor 20 a direct voltage of, for example, +3 volts is produced for the base of the transistor 1. This direct voltage is also applied to the cathode of a control-voltage (AVC) diode 21 to the anode of which part of the signal amplified in the intermediate-frequency amplifier 16 is applied through a capacitor 22. The control voltage obtained by detection at the anode of the diode 21 is applied via a smoothing filter comprising a resistor 23 and a capacitor 24 for gain control to the second high-frequency stage 14 and also, through a second smoothing filter comprising a resistor 25 and a capacitor 26, to the base of the transistor 2.

A resistor 27 which connects the +12-volts supply to the capacitor 24 produces a bias current which is supplied to the diode 21 through the resistor 23. This bias current ensures that the diode can detect signal amplitudes smaller than its own threshold voltage. In addition, the bias current produces a voltage drop across the resistor 23 and the diode 21 as a result of which the base of the transistor 2 has a positive voltage with respect to the base of the transistor 1. Consequently, when the diode 21 detects no signal or only small signals the transistor 2 will be rendered non-conducting with certainty and any signal received by the aerial is applied through the transistor 1 to the circuit 8, 9, 10.

When larger signals are applied by the intermediate-frequency amplifier 16 to the diode 21, the control voltage at the base of the transistor 2 varies in the negative sense (for example from +5 volts to +2.5 volts). As a result, with increasing control a progressively increasing part of the aerial signal current flows through the transistor 2 and hence a progressively smaller part flows through the transistor 1 to the circuit 8, 9, 10. In this manner normal AVC is effected.

According to the invention the collector circuit of the transistor 2 includes a resistor 29 shunted by a capacitor 28 whilst a limiter diode 30 is connected between the collectors of the two transistors. As far as the RF-signal voltages are concerned this limiter diode is in fact connected in parallel with the input circuit 8, 9, 10 through the capacitors 28 and 11. The direct current flowing through the transistor 2 produces a voltage across the resistor 29 which acts as a threshold voltage for the limiter diode 30. In proportion as the diode 21 detects a larger intermediate-frequency signal and hence the transistor 2 passes a larger direct current, the threshold voltage for the limiter diode 30 increases.

At small input signals the transistor 2 is non-conducting. However, in this case the amplitudes of the signals across the circuit 8, 9, 10 are smaller than the internal threshold (0.6 volt) of the diode 30, so that this diode remains non-conducting. If, however, the receiver is tuned to a large signal, the diode 21 applies a control voltage to the transistor 2 so that the latter takes over part of the signal current. At the same time the direct voltage across the resistor 29 and hence the threshold voltage for the diode 30 increase in a degree such that this diode remains non-conducting. Thus, in this case the increased attenuation of the input stage 1, 2 ensures that the signal at the input circuit remains small enough to prevent both detuning of the circuit and modulation distortion by the varactor. Also the limiter diode 30 is prevented from reducing the selectivity of the circuit.

On reception of a large signal outside the tuned range the diode 21 receives no signal and the AVC of the input stage 1, 2 is inoperative. The large signal is completely passed by the transistor 1. The diode 30, which in this case receives no threshold voltage from the resistor 29, is fully operative, however, and limits the voltage across the circuit to a value which is small enough to avoid troublesome effects of capacitance variations of the varactor 9.

Obviously the control stage, the preselection circuit and the limiter may be designed in a variety of manners. The invention is not restricted to AM receivers but may also be used to advantage in receivers for, for example, FM signals.

What is claimed is:

1. A circuit for a radio receiver having an intermediate frequency amplifier, said circuit comprising a control stage having an input means for receiving an input signal; a varactor tuned preselection circuit coupled to said control stage; a variable threshold limiter circuit coupled to said preselection circuit for limiting the received signal applied to said preselection circuit; and means for deriving from said amplifier a control voltage and for applying it to said control stage and said limiter to increase said threshold as the amplitude of the intermediate frequency increases.

2. A circuit as claimed in claim 1, wherein the control stage includes two emitter-coupled transistors, each having a base and a collector, the bases receiving said control voltage, the preselection circuit being coupled to the collector of one of the transistors, and an RC section coupled to the collector circuit of the other transistor, the limiter being coupled between the two collectors.

* * * * *